United States Patent
Rutten et al.

(10) Patent No.: US 8,193,501 B2
(45) Date of Patent: Jun. 5, 2012

(54) DETECTOR FOR AND A METHOD OF DETECTING ELECTROMAGNETIC RADIATION

(75) Inventors: Walter Rutten, Linnich (DE); Matthias Simon, Aachen (DE); Rainer Kiewitt, Roetgen (DE); Christoph Herrmann, Aachen (DE); Bernd Menser, Neu-Moresnet (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 509 days.

(21) Appl. No.: 12/374,394

(22) PCT Filed: Jul. 12, 2007

(86) PCT No.: PCT/IB2007/052783
§ 371 (c)(1),
(2), (4) Date: Jan. 20, 2009

(87) PCT Pub. No.: WO2008/012723
PCT Pub. Date: Jan. 31, 2008

(65) Prior Publication Data
US 2009/0321643 A1    Dec. 31, 2009

(30) Foreign Application Priority Data
Jul. 20, 2006    (EP) ..................................... 06117527

(51) Int. Cl.
  *G01J 5/20* (2006.01)
  *G01T 1/24* (2006.01)
(52) U.S. Cl. ................. 250/338.4; 250/370.08
(58) Field of Classification Search ............... 250/338.4, 250/370.08
See application file for complete search history.

(56) References Cited

U.S. PATENT DOCUMENTS

| | | | |
|---|---|---|---|
| 5,610,403 A * | 3/1997 | Kingsley et al. | 250/370.09 |
| 5,610,404 A * | 3/1997 | Possin | 250/370.09 |
| 6,225,632 B1 | 5/2001 | Kinno et al. | |
| 7,071,453 B1 * | 7/2006 | Pine | 250/208.1 |
| 2003/0052324 A1 | 3/2003 | Kimura | |
| 2010/0060300 A1* | 3/2010 | Muller et al. | 324/686 |

FOREIGN PATENT DOCUMENTS

| | | |
|---|---|---|
| EP | 0762506 A2 | 3/1997 |
| EP | 0762507 A2 | 3/1997 |
| EP | 1239666 A2 | 9/2002 |

OTHER PUBLICATIONS

H. Mori, et al., High resolution and High sensitivity CMOS Panel Sensors for X-Ray, IEEE 2001, Nuclear Science Symposium Conference Record, vol. 1, pp. 29-33, (2001).
W. Zhao, et al., Investigation of lag and ghosting in amorphous selenium flat-panel x-ray detectors, SPIE Medical Imaging, vol. 4682, pp. 9-20, (2002).
M.P. Andre, et al., SPIE Medical Imaging, vol. 3336, p. 204, (1998).

* cited by examiner

*Primary Examiner* — David Porta
*Assistant Examiner* — Mindy Vu

(57) ABSTRACT

A detector unit (301) for detecting electromagnetic radiation (106), the detector unit (301) comprising a conversion material (332) adapted for converting impinging electromagnetic radiation (106) into electric charge carriers, a charge collection electrode (331) adapted for collecting the converted electric charge carriers, a shielding electrode (334, 335) adapted to form a capacitance with the charge collection electrode (331), and an evaluation circuit (312 to 315) electrically coupled with the charge collection electrode (331) and adapted for evaluating the electromagnetic radiation (106) based on the collected electric charge carriers.

25 Claims, 5 Drawing Sheets

DETECTOR FOR AND A METHOD OF DETECTING ELECTROMAGNETIC RADIATION

FIELD OF THE INVENTION

The invention relates to a detector unit.

The invention further relates to a detector device.

Moreover, the invention relates to a method of detecting electromagnetic radiation.

Beyond this, the invention relates to a program element.

Furthermore, the invention relates to a computer-readable medium which is non-transitory in the sense that such a medium is not merely a signal.

BACKGROUND OF THE INVENTION

X-ray imaging is important in many technical fields including medical applications.

Medical imaging is the process by which physicians evaluate an area of the subject's body that is not externally visible. Medical imaging may be clinically motivated, seeking to diagnose and examine disease in specific human patients. Alternatively, it may be used by researchers in order to understand processes in living organisms. Many of the techniques developed for medical imaging also have scientific and industrial applications.

In the case of radiography, the probe is an X-ray beam which is absorbed at different rates in different tissue types such as bone, muscle and fat. After having propagated through the body of the object under examination, the transmitted X-ray beam generates an intensity pattern being indicative of the internal structure of the object under examination.

Currently, most solid-state digital X-ray detectors in the market are built of a flat glass plate with amorphous silicon (a-Si) thin film electronics and an X-ray conversion layer on top of it. They are either of the indirect conversion type with a scintillator on top of an array of photodiodes or of the direct conversion type using a photoconductor on top of an array of electrodes. The impinging X-rays are absorbed in the conversion layer and, via the generated charges in each pixel of the array, create a digital image of the X-ray absorption.

An alternative to thin film electronics on glass is the use of wafers of monocrystalline silicon for the pixel electronics. As above, pixels with or without photodiodes can be built for either indirect or direct X-ray conversion. The use of standard CMOS processes in monocrystalline silicon leads in general to electronic circuits with less noise and more functionality compared to a-Si pixel circuits. In case of an indirect conversion detector, the scintillator can either be glued or grown directly on the Si wafer. For direct X-ray conversion materials there are also two possibilities: either connecting a separately fabricated layer, for example with bumb balls or a direct deposition on silicon. An example of a CMOS detector of the indirect conversion type can be found in H. Mori, R. Kyuushima, K. Fujita, M. Honda, "High Resolution and High Sensitivity CMOS PANEL SENSORS for X-ray", IEEE 2001 Nuclear Science Symposium Conference Record, Vol. 1, pp. 29-33 (2001).

Furthermore, reference is made to W. Zhao, G. DeCrescenzo, J. A. Rowlands, "Investigation of lag and ghosting in amorphous selenium flat-panel x-ray detectors", SPIE Medical Imaging Vol. 4682, pp. 9-20, 2002.

However, conventional detectors may have a sensitivity which may be insufficient for specific applications.

OBJECT AND SUMMARY OF THE INVENTION

It is an object of the invention to provide a sufficiently sensitive detector.

In order to achieve the object defined above, a detector unit, a detector device, a method of detecting electromagnetic radiation, a program element, and a computer-readable medium according to the independent claims are provided.

According to an exemplary embodiment of the invention, a detector unit for detecting electromagnetic radiation is provided, the detector unit comprising a conversion material adapted for converting impinging electromagnetic radiation into electric charge carriers, a charge collection electrode adapted for collecting the converted electric charge carriers, a shielding electrode adapted to form a capacitance with the charge collection electrode, and an evaluation circuit electrically coupled with at least a part of (or entirely with) the charge collection electrode and adapted for evaluating the electromagnetic radiation based on the collected electric charge carriers. Optionally, the evaluation circuit may be electrically coupled (for instance by an ohmic coupling) with the shielding electrode.

According to another exemplary embodiment of the invention, a detector device for detecting electromagnetic radiation is provided, the detector device comprising a plurality of interconnected (for instance arranged in a matrix-like array, having row lines and column lines) detector units having the above mentioned features.

According to still another exemplary embodiment of the invention, a method of detecting electromagnetic radiation is provided, the method comprising converting impinging electromagnetic radiation into electric charge carriers, collecting the converted electric charge carriers at a charge collection electrode, and evaluating, by an evaluation circuit, the electromagnetic radiation based on the collected electric charge carriers, wherein the evaluation circuit may optionally be electrically coupled with at least a part of a shielding electrode provided to form a capacitance with the charge collection electrode.

According to yet another exemplary embodiment of the invention, a computer-readable medium is provided, in which a computer program of detecting electromagnetic radiation is stored which, when being executed by a processor, is adapted to control or carry out a method having the above mentioned features.

According to still another exemplary embodiment of the invention, a program element of detecting electromagnetic radiation is provided, which program element, when being executed by a processor, is adapted to control or carry out a method having the above mentioned features.

Data processing for process control and/or data evaluation purposes which may be performed according to embodiments of the invention can be realized by a computer program, that is by software, or by using one or more special electronic optimization circuits, that is in hardware, or in hybrid form, that is by means of software components and hardware components.

In the context of this application, the term "electromagnetic radiation" may particularly denote photons of any desired wavelength or frequency domain to which a conversion material is sensitive. Particularly, electromagnetic radiation in the γ regime, in the X-ray region, in the infrared region, in the optical region, and in the ultraviolet region may be covered by this term.

The term "conversion material" may particularly denote any material which is capable of converting impinging electromagnetic radiation (for instance of a particular frequency or frequency range) into electric charge carriers like (negatively charged) electrons and/or (positively charged) holes. Examples for such a conversion material with regard to X-ray radiation are selenium, mercury iodide, lead oxide or CdTe. The selection of a conversion material for a specific application may be performed in accordance with an electromagnetic radiation to which the conversion material shall be sensitive.

The term "evaluation circuit" may particularly denote any conventionally wired or integrated circuit which may comprise circuit components like transistors, impedances, ohmic resistances, capacitances, inductances, logic gates, microprocessors, etc. Such an evaluation circuit may have the capability of evaluating an electric signal (like a charge signal or a voltage signal or a current signal) generated by components of the detector unit and being indicative of an amount (for instance of an energy) of an electromagnetic beam impinging on the detector unit or pixel. Such an evaluation circuit may be formed as an integrated circuit, for instance on and/or in a monocrystalline substrate like a silicon wafer.

The term "bootstrap" may particularly denote a circuitry or logic according to which a reference potential or shielding potential is forced to follow an input signal to a corresponding level.

The term "shielding electrode" may particularly denote an electrode which shields the charge collection electrode against the evaluation circuit. Thus, the shielding electrode may at least partially electrically decouple the charge collection electrode from the evaluation circuit, so that for example relatively large voltages in the evaluation circuit do not negatively influence the sensor accuracy of the charge collection electrode.

The capacity formed by the shielding electrode and the charge collection electrode may be used to convert a generated amount of electric charge into an electric voltage, serving as a detection signal. Thus, the value of the capacity may have an influence on the sensitivity. By shielding the charge collection electrode with regard to the evaluation circuit, undesired influences caused by electric signals propagating in the evaluation circuit which may disturb the charge collection accuracy of the charge collection electrode may be suppressed or eliminated.

In a stacked layer sequence of the detector unit realized in integrated circuit technology, the evaluation circuit may be buried in and/or provided on a substrate below a shielding electrode, located in turn below a charge collection electrode, located in turn below a conversion material. Thus, the shielding electrode may be sandwiched between the evaluation circuit and the charge collection electrode.

According to an exemplary embodiment, a shielding electrode of a detector unit may at least partially be electrically coupled (for instance ohmically) to an evaluation circuit, thereby allowing to significantly decrease a value of a capacitance formed between the shielding electrode and the charge collection electrode. By taking this measure, the sensitivity of the detector unit may be significantly improved.

In order to reduce the value of the capacity, exemplary embodiments of the invention may use a bootstrapping circuit reducing the effective pixel capacitance (which may be used to integrate charges generated by interaction of X-rays with a direct converting sensor material), and hence may result in a higher sensitivity in terms of output voltage versus input charge.

By splitting the shielding electrode into two or more components (which may be ohmically decoupled), and by connecting a part to the bootstrapping circuit and a part to a reference potential, the effective pixel capacitance can be selectively adjusted in a user-defined manner between a low value provided by the part of the shielding electrode connected to the bootstrapping circuit, and a high value provided by the part of the shielding electrode connected to the reference potential. This allows to adjust (in a stepless or step-wise manner) the sensitivity of the detector unit automatically or under the control of a user. For this purpose, a control switch or regulator may be foreseen. By such a switch, it may be possible to selectively connect each individual electrode structure to a reference potential or to the evaluation circuit. Such a selection may therefore have an influence on the effective capacity.

However, according to an exemplary embodiment, both components (grounded portion and portion coupled to the evaluation circuit) may be effective, with regard to a contribution to the capacity. When a part of the electrode would be connected neither to the bootstrap circuit nor to a reference potential, the shielding is interrupted or non-continuous, and the capacity between the pixel electrode and the below positioned electronics would become effective. In a practical implementation, it may be advantageous to connect all components of the shielding electrode to one of the (defined) potentials or components. Thus, an unconnected "floating" electrode is in principal possible, but in many cases not desired.

Thus, according to an exemplary embodiment, a direct conversion CMOS X-ray detector with high sensitivity may be provided. Embodiments of the invention refer to an X-ray detector, which uses direct X-ray conversion combined with CMOS pixel circuits.

Such a pixel circuit may provide a very high sensitivity by means of a bootstrap circuit which may reduce the effective capacitance of the charge collection electrode.

Typically, the pixel pitch in flat X-ray detectors may reach from 150 µm to 200 µm except for mammography and dental imaging, where pixel sizes of less than 100 µm are common. A trend can be observed in X-ray imaging, that the spatial resolution also for cardiology, neurology and vascular applications is going to be increased. The pixel size of a monocrystalline silicon detectors can easily be reduced to values far below 100 µm because of the small feature sizes, which are possible with this technology for transistors and other electronic elements.

However, in the case of an indirect conversion detector, the spatial resolution may be limited by the light spread in the scintillator. In many cases its thickness cannot be reduced to maintain a high X-ray absorption yield. To fully exploit the high spatial resolution of a detector with small pixels, direct X-ray conversion may be suited better. Direct conversion materials like selenium, mercury iodide, lead oxide or CdTe can be easily made thick enough to absorb more than 80% of the X-rays with a beam quality typical for medical imaging. A very high spatial resolution may be achieved because the generated charge carriers (electrons and/or holes) may follow the field lines of the applied bias field, which may run perpendicular to the surface of the pixel electrode and the usually unstructured top electrode. One example of a direct conversion type CMOS detector is disclosed in M. P. Andre et al., SPIE Medical Imaging Vol. 3336, pp. 204 (1998).

Besides the spatial resolution, another advantage of a direct conversion CMOS detector is a possibility to overcome the limited fill factor of a photodiode in a small pixel. In a direct conversion detector, a metal layer covering nearly the whole pixel area can serve as pixel electrode.

In the case of a direct conversion solid state X-ray detector, nearly the complete pixel surface may act as collection electrode. This electrode may be part of the pixel capacitance and may be very sensitive to both the input charge and disturbing signals from the underlying electronics. Hence, a shielding electrode connected to a reference potential may be implemented below the collection electrode to provide a stable second electrode for the pixel capacitor and to keep unwanted disturbing signals from reaching the charge collection electrode.

This arrangement of charge collection electrode and shielding electrode may form the input capacitance or may contribute to the input capacitance. The value of this capacitance may be dictated by the pixel size and the actual fabrication process used to build the pixel and may be frequently larger than wished for, hence resulting in a too low sensitivity of the circuit.

Embodiments of the invention may make use of a bootstrapping circuit which may reduce the effective pixel capacitance (used to integrate charges generated by interaction of X-rays with the direct converting sensor material) and hence may result in a higher sensitivity in terms of output voltage versus input charge.

By partitioning the shielding electrode and by coupling part to the bootstrapping circuit and part to a reference potential (like a ground potential), the effective pixel capacitance can be adjusted between the very low value provided by only the bootstrapping circuit and the high value provided by only the reference potential at the shielding electrode.

Embodiments of the invention can be applied to all sorts of X-ray detectors using direct X-ray conversion and pixel electronics, particularly using CMOS technique. CMOS is particularly appropriate for embodiments of the invention, since it is properly developed and wide spread. However, embodiments of the invention may also be implemented in other technologies.

Exemplary fields of applications of embodiments of the invention can be for example cardio-vascular X-ray, general X-ray, neurology, orthopaedics, mammography and dental imaging.

By placing a conversion material reacting to (far) infrared radiation on the sensor, a thermal imaging device can be built. Embodiments of the invention may therefore be implemented for very different ranges of wavelengths.

Exemplary medical applications of X-ray systems may include the examination of human beings, but also of animals so that embodiments of the invention may be employed in the veterinary field.

Next, further exemplary embodiments of the detector unit (for instance a pixel of a detector device) will be described. However, these embodiments also apply for the detector device (for instance an array comprising a plurality of pixels), for the method, for the program element and for the computer-readable medium.

The evaluation circuit may be electrically (for instance ohmically) coupled with at least a part of the shielding electrode. This may allow to reduce the value of the capacity C formed by the charge collection electrode and the shielding electrode, which may have an impact on the sensitivity of the detector or sensor. For instance, when an amount Q of charge is generated in the conversion material based on an impinging beam of radiation, the capacity C may contribute to a conversion of this charge Q into a detector voltage U. Following the simple equation $CU=Q$ or $U=Q/C$, a smaller value of the capacitance C may result in a higher voltage per charge, thereby increasing sensitivity.

At least a part of the shielding electrode may be electrically coupled with a reference potential. Such a portion of the shielding electrode may guarantee that the value of the capacity C does not become too small, guaranteeing also that U does not exceed an upper threshold value. Thus, a grounded part of the shielding electrode may prevent an over voltage or saturation of the evaluation circuit.

The shielding electrode may comprise a first portion electrically coupled to the evaluation circuit, and may comprise a second portion electrically decoupled from the evaluation circuit. In other words, the shielding element may be split into a first portion which is connected directly to an evaluation circuit which may be configured in bootstrapping architecture. In contrast to this, a second portion may be electrically decoupled (for instance ohmically decoupled) from the evaluation circuit and also from the first portion of the shielding electrode. By taking this measure, the first portion may provide a low contribution to the capacitance, whereas the second portion may provide a larger contribution to the capacitance. Therefore, by selectively switching "on" or "off" the first portion and/or the second portion to the remaining components of the detector unit, a selective adjustment of the effective capacitance may be achieved. It is also possible that the shielding electrode is split in a plurality of (more than two) portions, that is to say in at least one additional portion in addition to the first portion and the second portion. Such a procedure may allow to refine the adjustment feature. However, "floating" electrodes may be undesirable.

The second portion may be electrically coupled with a reference potential, for instance with a ground potential ($V_{ss}$). However, it is also possible that the second portion is electrically coupled with an upper potential (for instance of a power supply voltage, $V_{dd}$) of an integrated circuit.

The detector unit may comprise an adjustment unit adapted for adjusting the value of the capacitance formed by the shielding electrode and the charge collection electrode by adjusting at least one of the first portion and the second portion. Such an adjustment may allow to increase the flexibility of using the detector unit, since a capacitance may be controlled in any desired manner. Such an "adjustment" may include selectively connecting or disconnecting portions of the shielding electrode, adjustment of electrode dimension and/or geometry and/or coupling the electrode to a specific electric potential or to a specific circuit component.

The evaluation circuit may be configured as a bootstrap circuit. By this configuration, the sensitivity of the detector unit may be significantly increased, since a shielding electrode of a detector unit may now be connected also to the evaluation circuit, to improve functionality of the system.

The evaluation circuit may comprise a switch element adapted for selectively resetting the charge collection electrode using a control signal provided via a reset line. Such a switch element may be a transistor, wherein a signal supplied to a gate connection of the transistor (like a field effect transistor) may serve as a control signal for controlling the conduction state of the transistor. With an appropriate control signal, the switch element may be made conductive or non-conductive, thereby allowing to reset the detection state of the evaluation circuit by guiding charge generated by a previous detection for instance to ground, or by bringing the charge collection electrode to a predetermined electrical potential.

The evaluation circuit may further comprise a buffer element (which may also have the function of an amplifier) coupled to the charge collection element and adapted to buffer the potential of the charge collection electrode. The potential may therefore be "copied" or stored in the buffer element, for a subsequent analysis. A gain factor provided by the buffer element may be close to one.

For example, the buffer element may comprise a source follower, particularly a source follower having a bulk contact electrically coupled to a source contact thereof. Such a source follower may be a correspondingly controlled field effect transistor (FET). In a configuration with a bulk contact being electrically coupled to a source contact, the accuracy of the detection may be further increased.

Still referring to the previously described embodiment, the evaluation circuit may further comprise a further switch element connected between the buffer element and a readout line and adapted for selectively coupling or decoupling the buffer unit to or from the readout line. The readout line may be a connection of the detector unit to other detector units of a detector array or detector device, wherein a signal indicative of the detection result of the detector unit may be supplied to a central control unit via the readout line.

The evaluation circuit may comprise a load element (for instance a resistor, that is to say an ohmic load element) coupled to at least a part of the shielding electrode. By connecting such a load element into the evaluation circuit, an operating point of the evaluation circuit may be properly defined, thereby allowing to improve the accuracy of the system. As an alternative to a resistance, it may be even more desirable to use a (constant) current source.

The conversion material may be a direct conversion material. In other words, the detector unit may be adapted for a direct conversion of electromagnetic radiation into an amount of charge.

The conversion material may be located on the charge collection electrode. For instance, the charge collection electrode may be a metal layer in a semiconductor stack, which may be then covered with conversion material to be deposited thereon. On top of the conversion material, a high voltage top connection may be provided.

In the following, further exemplary embodiments of the detector device will be explained. However, these embodiments also apply to the detector unit, to the method, to the program element and to the computer-readable medium.

At least a part of the detector device may be formed as a monolithically integrated circuit, particularly may be formed in CMOS technology. Thus, at least a part of the detector may be monolithically integrated within a substrate, particularly a semiconductor substrate, more particularly a silicon substrate. However, embodiments of the invention may also be applied in the context of group III-V semiconductors, like gallium arsenide. Such a monolithically integration may significantly reduce the dimensions of the detector unit, and may therefore improve the spatial resolution. Further, the signal processing paths may be kept short in an integrated solution, so that the length of a conduction path along which the signals may be negatively influenced by disturbing effects may be reduced. Therefore, such a monolithically integrated detector may be particularly advantageous.

The detector device may be adapted as at least one of the group consisting of an X-ray detector device, an optical detector device, and an infrared detector device. An X-ray detector device may therefore be capable to detect X-rays generated by an X-ray source and transmitted through and/or scattered by an object under investigation. In an infrared detector device, infrared radiation may be detected. When the conversion material is sensitive to visible light, the detector device may also serve as a camera. More generally, be selecting the direct conversion material to be sensitive to a specific frequency range of electromagnetic radiation, almost any desired radiation frequency may be used as a basis for the detection.

The detector device may be configured as a cardiovascular apparatus, a neurology apparatus, an orthopaedics apparatus, a mammography apparatus, a dental imaging apparatus, a baggage inspection apparatus, a medical application apparatus, a material testing apparatus or as a material science analysis apparatus. More generally, the detector device may be employed in any field in which a transmission or absorption of X-rays or other electromagnetic radiation may be measured.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
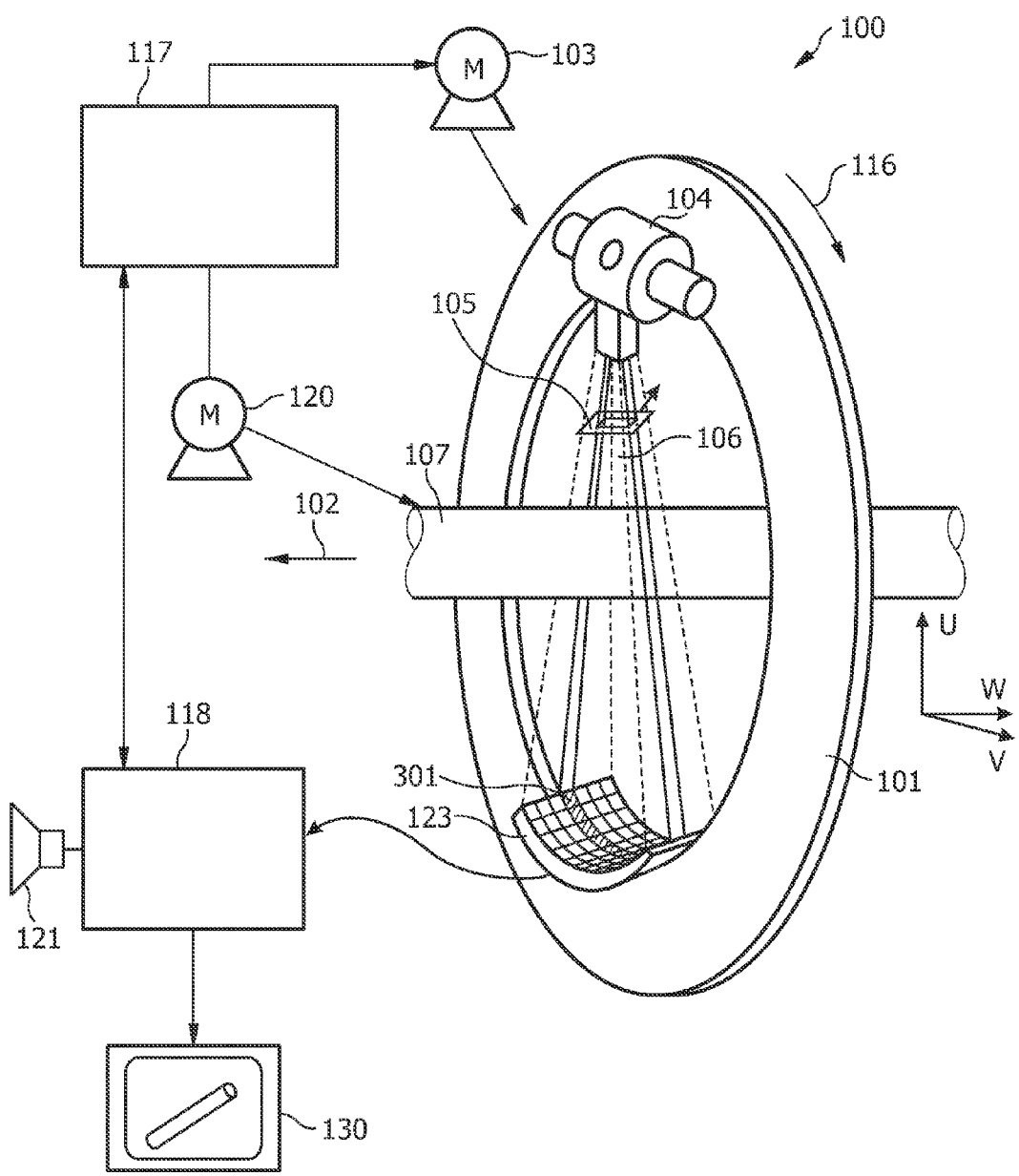
FIG. 1 shows a computer tomography apparatus in which a detector device according to an exemplary embodiment of the invention is implemented.

The illustration in the drawing is schematically. In different drawings, similar or identical elements are provided with the same reference signs.

In the following, referring to FIG. 1, a computer tomography apparatus 100 according to an exemplary embodiment of the invention will be described.

In the computer tomography apparatus 100, a detector device 123 is included which is formed of a plurality of detector units 301 according to exemplary embodiments of the invention. The detector device 123 will be explained in more detail referring to FIG. 3. Embodiments of the detector units 301 will be explained schematically referring FIG. 2 and in more detail referring to FIG. 5 to FIG. 8.

The computer tomography apparatus 100 depicted in FIG. 1 is a fan-beam CT scanner. The scanner depicted in FIG. 1 comprises a gantry 101, which is rotatable around a rotational axis 102. The gantry 101 is driven by a motor 103. Reference numeral 104 designates a source of radiation such as an X-ray source, which, according to an aspect of the present invention, may emit a polychromatic radiation or an essentially monochromatic radiation.

Reference numeral 105 designates an aperture system which forms the radiation beam emitted from the radiation source 104 to a fan-shaped radiation beam 106. The fan-beam 106 is directed such that it penetrates an object of interest 107 arranged in the center of the gantry 101, i.e. in an examination region of the scanner 100, and impinges onto a detector 123. As may be taken from FIG. 1, the detector 123 is arranged on the gantry 101 opposite to the source of radiation 104, such that the surface of the detector 123 is covered by the fan-beam 106.

The detector device 123 depicted in FIG. 1 comprises a plurality of detector elements or detector units 301 each capable of detecting X-rays which have been transmitted through the object of interest 107.

During a scan of the object of interest 107, the source of radiation 104, the aperture system 105 and the detector 123 are rotated along the gantry 101 in the direction indicated by an arrow 116. For rotation of the gantry 101 with the source of radiation 104, the aperture system 105 and the detector 123, the motor 103 is connected to a motor control unit 117, which is connected to a calculation or determination unit 118.

In FIG. 1, the object of interest 107 is an item of baggage which is disposed on a conveyor belt (not shown). During the scan of the object of interest 107, while the gantry 101 rotates around the item of baggage 107, the conveyor belt displaces the object of interest 107 along a direction parallel to the rotational axis 102 of the gantry 101. By this, the object of interest 107 is scanned along a helical scan path. The conveyor belt may also be stopped during the scans to thereby measure signal slices. Instead of providing a conveyor belt, for example in medical applications where the object of interest 107 is a patient, a moveable table may be used. However, it should be noted that in all of the described cases it is also possible to perform a circular scan, where there is no displacement in a direction parallel to the rotational axis 102, but only the rotation of the gantry 101 around the rotational axis 102.

As shown in FIG. 1, the embodiment can be realized by a fan-beam configuration. In order to generate a primary fan-beam, the aperture system 105 is configured as a slit collimator.

The detector 123 is connected to a determination unit 118. The determination unit 118 receives the detection result, i.e. the read-outs from the detector elements 301 of the detector 123 and determines a scanning result on the basis of these read-outs. Furthermore, the determination unit 118 communicates with a motor control unit 117 in order to coordinate the movement of the gantry 101 with motors 103 and 120 with the conveyor belt.

The determination unit 118 may be adapted for reconstructing an image from read-outs of the detector 123 using a tomographic reconstruction. A reconstructed image generated by the calculation unit 118 may be output by a display unit 130.

The determination unit 118 may be realized by a data processor to process read-outs from the detector elements 301 of the detector 123.

Furthermore, as may be taken from FIG. 1, the determination unit 118 may be connected to a loudspeaker 121, for example to automatically output an alarm in case of the detection of suspicious material in the item of baggage 107.

Embodiments of the detector device 123 may be used, as an alternative to a CT apparatus, for any other desired technical application, for instance for 2D projection X-ray systems.

In the following, referring to FIG. 2, a detector unit 301 according to an exemplary embodiment of the invention will be explained in more detail.

The detector unit 301 is adapted for detecting X-rays and comprises a direct conversion material 332 adapted for converting impinging electromagnetic radiation 106 into electric charge carriers, namely electrons and/or holes.

The direct conversion material 332 is contacted and therefore electrically connected to a charge collection electrode 331 adapted for collecting the converted electric charge carriers. This functional connection is indicated by an arrow 251.

Furthermore, a shielding electrode 335 is provided which is adapted to form a capacitance with the charge collection electrode 331. In other words, the components 331 and 335 comprise electrically conductive planar portions which are located opposing to one another, thereby forming a capacitance.

Beyond this, an evaluation circuit 200 is provided as an integrated circuit which is electrically coupled (see arrow 252) with the charge collection electrode 331 and which is adapted for evaluating the electromagnetic radiation 106 (qualitatively and/or quantitatively) based on the collected electric charge carriers. Furthermore, the evaluation unit 200 is electrically coupled with the shielding electrode 335, as indicated by an arrow 253.

Figure 2:
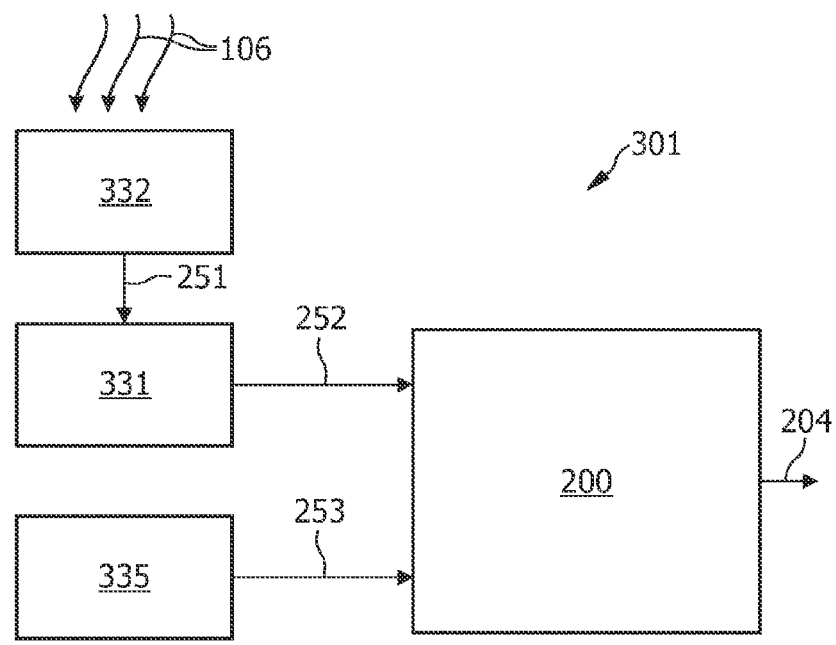
FIG. 2 shows a detector unit according to an exemplary embodiment of the invention.

Although not shown in FIG. 2, the shielding electrode 335 is located between the charge collection electrode 331 and the evaluation circuit 200. Consequently, the shielding electrode 335 prevents the charge collection electrode 331 from being negatively influenced by relatively high voltages occurring in the evaluation circuit 200.

The evaluation circuit 200 comprises evaluation circuitry which is capable of generating an output signal 204 indicative of the amount, energy, etc., of the electromagnetic radiation 106. Such a result signal may be supplied to a processor for further processing, interpretation or output.

In the following, referring to FIG. 3, a detector device 123 according to an exemplary embodiment of the invention will be explained.

The detector device 123 may be implemented in a computer tomography apparatus (like the one shown in FIG. 1), in a radiography system, or in any other technical environment in which X-ray detection is desired.

Figure 3:
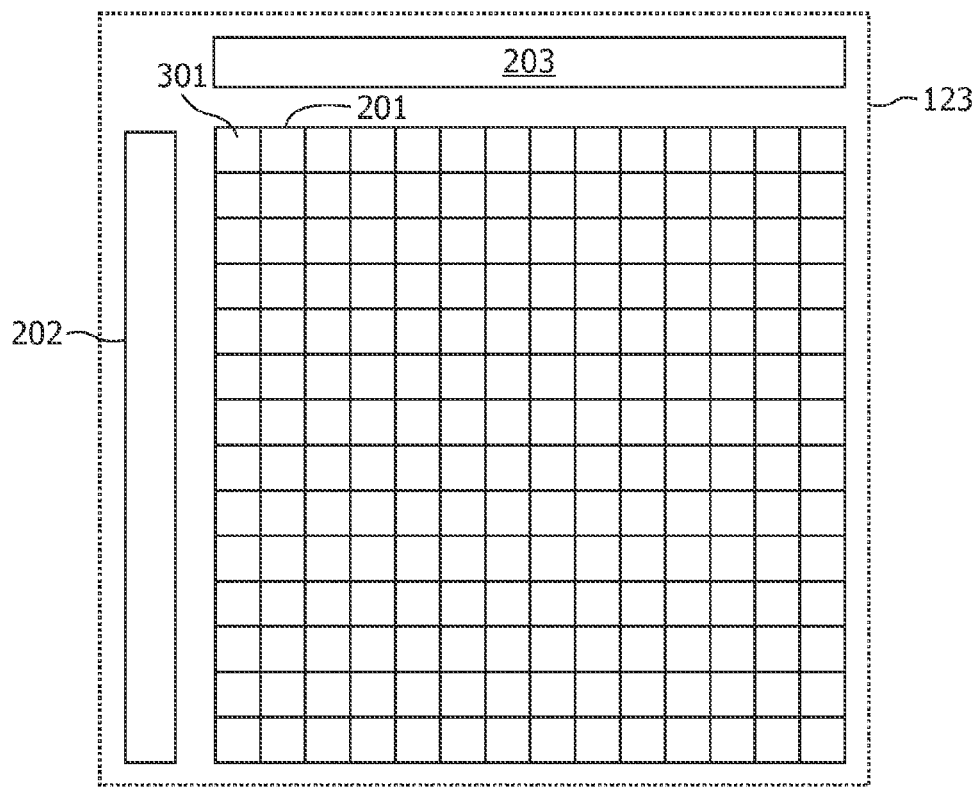
FIG. 3 shows a detector device according to an exemplary embodiment of the invention.

As shown in FIG. 3, the solid state X-ray detector 123 comprises an array 201 of pixel cells 301 and associated line driver circuits 202 and readout amplifiers/multiplexers 203. An indirect conversion detector unit 301' may use a circuit as shown in FIG. 4.

It comprises a photodiode 311 which can be reset to a supply voltage by means of a switching device 312 which is controlled by a reset line 321. This connection is also referred to an input node A. The X-ray or light exposure reduces the voltage on the input node A. During readout, the voltage on this node is copied by a buffer, like a source follower 313, and placed on a readout line 323 by means of the readout switch 314 which is actuated by a control line 322. The usual n-channel source follower 313 may be manufactured in a standard CMOS process on a p-epitaxial layer and may have a gain of approximately 0.8, hence the signal from the input node A is copied only in reduced form to the readout line 323, affecting the achievable signal to noise ratio.

Figure 5:
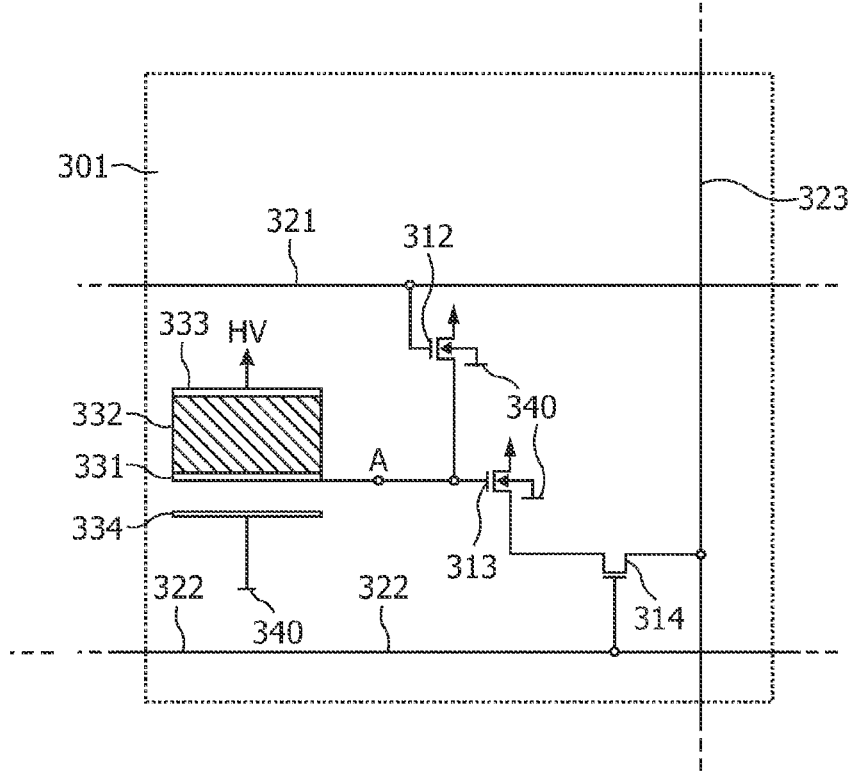
FIG. 5 to FIG. 8 shows detector units of detector devices according to exemplary embodiments of the invention.

A direct conversion detector 301 according to an exemplary embodiment of the invention may use a circuit as shown in FIG. 5.

Figure 4:
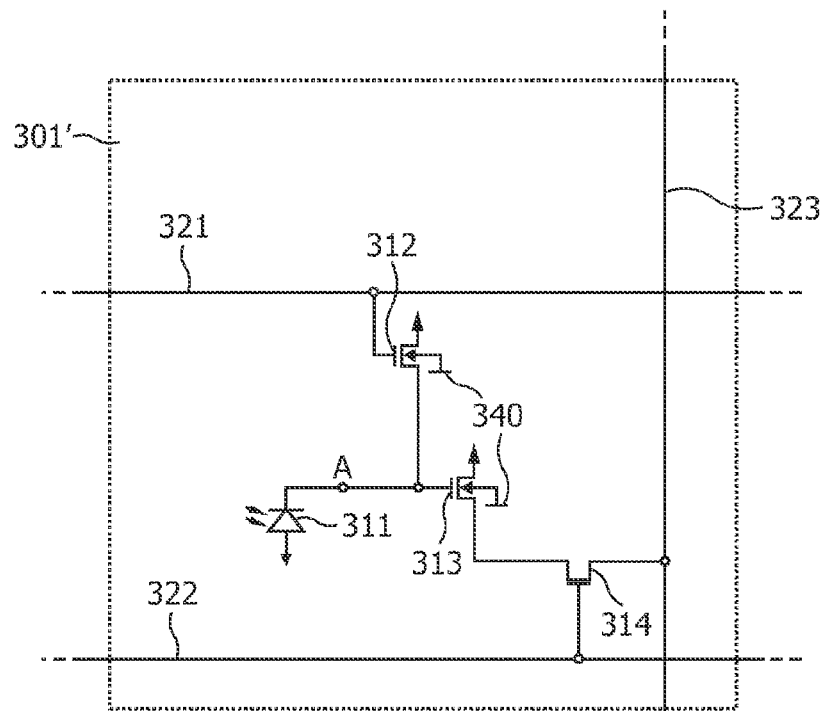
FIG. 4 show a detector unit of a detector device.

In the case of a direct conversion X-ray detector unit 301 as shown in FIG. 5, the photodiode 311 of FIG. 4 is replaced by a charge collection electrode 331 and a shielding electrode 334 which is in first instance connected to a reference potential 340. The charge collection electrode 331 can be made in the top metal of the backend stack, the reference electrode 334 in the next lower metal layer. The direct conversion material 332 is connected to the charge collection electrode 331 and has also a top contact 333 which is connected to a high voltage supply HV.

Electrodes 331 and 334 form a large part of the input capacitance C_in, the rest being allocated in the connections, the reset switch 312 and the source follower 313.

The function of the circuit of FIG. 5 is unchanged from the previous case of FIG. 4, the only difference being that now the charges collected from the direct conversion material 332 fill the pixel capacitance and hence change the voltage on the input node A.

Figure 6:
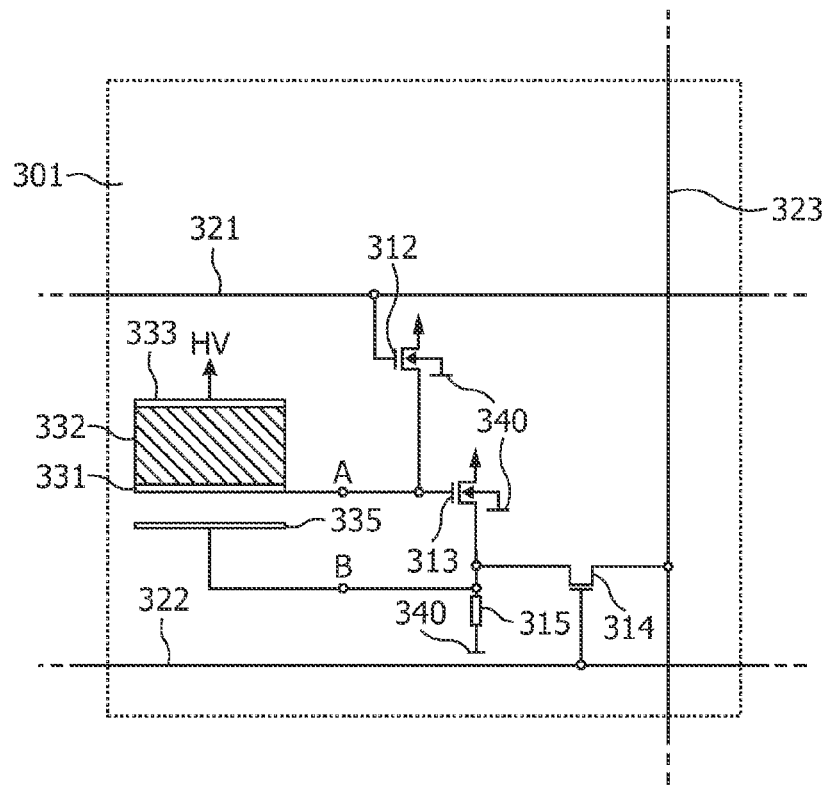

A direct conversion detector according to another exemplary embodiment of the invention is shown in FIG. 6.

The embodiment of FIG. 6 shows a detector unit 301 for detecting electromagnetic radiation and comprises a direct conversion material 332 adapted for converting impinging electromagnetic radiation directly into electric charge carriers.

Furthermore, a charge collection electrode 331 is provided and adapted for collecting the converted electric charge carriers. Beyond this, a top contact 333 which is connected to a high voltage supply (HV) is shown as well.

A shielding element 335 is electrically decoupled from the charge collection electrode 331 and is adapted to form a capacitance with the charge collection electrode 331.

An evaluation circuit is formed by components 312 to 315, as will be explained below in more detail. The evaluation circuit 312 to 315 is ohmically coupled to the charge collection electrode 331 and is adapted for evaluating the electromagnetic radiation based on the collected electric charge carriers. As can be taken from FIG. 6, the evaluation circuit 312 to 315 is electrically coupled also with the shielding electrode 335.

The evaluation circuit comprises a switch element 312 adapted for selectively coupling or decoupling the charge collection electrode 331 to a reference potential in dependence of a value of a control signal supplied by a reset line 321 to a gate terminal of the switch element 312. With the switch element 312, the pixel 301 can be reset to a default state for a new measurement.

The evaluation circuit may further comprise a buffer element 313 in the form of a source follower transistor 313. The buffer element 313 is coupled to the charge collection electrode 331 and is adapted to buffer electric charge carriers collected by the charge collection electrode 331.

A further switch element 314 is provided in the evaluation circuit and is connected between the buffer element 313 on the one hand and a readout line 323 on the other hand, and is adapted for selectively coupling or decoupling the buffer unit 313 to or from the readout line 323. For this purpose, a control line 322 is provided which is connected to a gate terminal of the transistor switch 314, thereby controlling whether the transistor 314 is conductive or not.

Beyond this, the evaluation circuit comprises a load element 315 coupled to the shielding electrode 335. The load element 315 has one connection which is brought to the ground potential 340.

In FIG. 6, the reference electrode 334 is replaced by a bootstrap electrode 335 which in turn connects to the source of source follower 313. An optional load device 315 can be applied to provide a defined operation point during integration, but without the load device 315, the circuit will function anyway when a defined source current is applied during readout.

As the voltage on the input node A changes during exposure, the voltage on the bootstrapping connection B will follow with the gain g of the source follower 313. A certain charge on the input node will still effect the same voltage difference of the input capacitance C_in as in the previous case, but due to the coupling of bootstrapping point B with input node A, the voltage swing of the input node A with respect to the reference potential is larger, corresponding to a smaller effective input capacitance $C\_eff = C\_in \cdot (1-g)$.

Hence, the bootstrapped circuit may provide a higher sensitivity in terms of output voltage per input charge.

Figure 7:
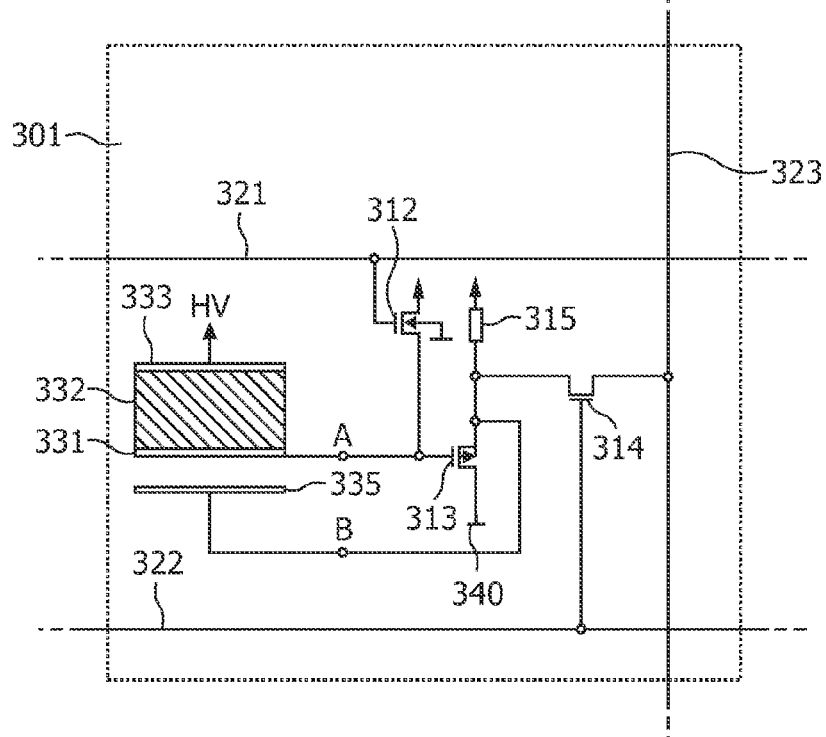

A further improvement can be achieved by changing the source follower 313 into a device which has a gain very close to 1.0. Such a device may be a source follower, where the bulk contact can be attached to the source contact. In standard CMOS processes, this is usually a p-channel transistor as shown in FIG. 7. The optional load device 315 is again connected to the source of the source follower 313.

Connecting the bulk contact to the source leads to a source follower 313 with a gain very close to 1.0, hence the reduction in effective capacitance as explained in the previous section is very large.

Correspondingly, the sensitivity may be considerably increased.

Figure 8:
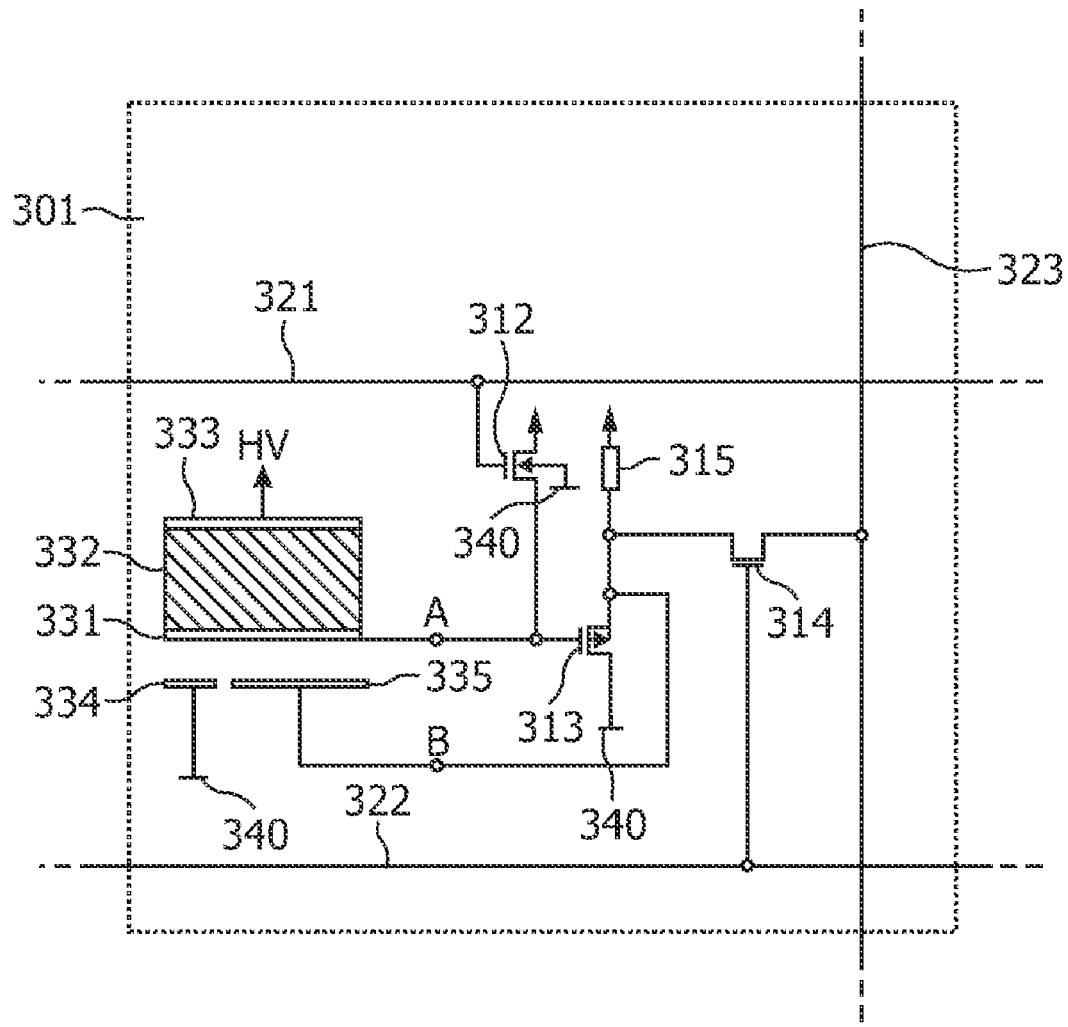

A circuit according to a preferred embodiment of the invention is shown in FIG. 8.

In the embodiment of FIG. 8, the shielding electrode comprises a first portion 335 electrically coupled to the evaluation circuit, more precisely to the load element 315 and to the source follower 313. In contrast to this, a second portion 334 of the shielding electrode is decoupled from the evaluation circuit and is brought to the ground potential 340.

The embodiment of FIG. 8 contains many improvements like bootstrapping, use of a buffer with gain near to 1.0 and a combination of bootstrapped shielding electrode 335 and fixed potential reference electrode 334 to adjust the sensitivity.

If parts of the reference electrode can be switched either to the fixed reference potential or to the bootstrapping point B, the sensitivity can even be made selectable during operation.

The circuit shown in FIG. 8 is partially self protecting against leakage currents. If the n-MOS reset switch 312 is used with a negative high voltage on the direct conversion material, a high leakage current will turn on the reset switch and the current will be drained to the supply voltage.

If a positive high voltage is used, a p-MOS reset switch will likewise drain the excessive current and protect the buffer.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A detector unit for detecting electromagnetic radiation, the detector unit comprising;
    a conversion material configured for converting impinging electromagnetic radiation into electric charge carriers;
    a charge collection electrode configured for collecting the converted electric charge carriers;
    a shielding electrode configured for forming a capacitance with the charge collection electrode; and
    an evaluation circuit electrically coupled with the charge collection electrode and configured for evaluating the electromagnetic radiation based on the collected electric charge carriers,
    said shielding electrode, said charge, collection electrode and said circuit corresponding to separate respective layers that of said shielding electrode spatially intervening between those of said charge collection electrode and said circuit.

2. The detector unit of claim 1, wherein at least a part of the shielding electrode is electrically coupled with a reference potential.

3. The detector unit of claim 1, wherein the evaluation circuit is configured as a bootstrap circuit for reducing effective pixel capacitance to achieve higher sensitivity in terms of output voltage versus input charge.

4. The detector unit of claim 1, wherein the evaluation circuit comprises a switch element configured for selectively resetting the charge collection electrode using a control signal provided via a reset line.

5. The detector unit of claim 1, wherein the evaluation circuit comprises a buffer element coupled to the charge collection electrode and configured for buffering a potential of the charge collection electrode.

6. The detector unit of claim 5, wherein the buffer element comprises a source follower, particularly a source follower having a bulk terminal electrically coupled to a source terminal.

7. The detector unit of claim 5, wherein the evaluation circuit comprises a further switch element connected between the buffer element and a readout line and configured for selectively coupling or decoupling the buffer unit to or from the readout line.

8. The detector unit of claim 1, the evaluation circuit comprising a load element, particularly an ohmic load element or a current source, coupled to at least a part of the shielding electrode.

9. The detector unit of claim 1, wherein the conversion material is a direct conversion material.

10. The detector unit of claim 1, wherein the conversion material is provided on the charge collection electrode.

11. The detector unit of claim 1, wherein the shielding electrode is configured for electrically shielding the charge collection electrode against at least one of the group consisting of the evaluation circuit, control lines and supply lines.

12. The detector unit of claim 1, wherein the evaluation circuit comprises a self-protection mechanism configured for suppressing leakage currents.

13. A detector device for detecting electromagnetic radiation, the detector device comprising a plurality of interconnected detector units of claim 1.

14. The detector device of claim 13, wherein at least a part of the detector device is formed as a monolithically integrated circuit, particularly is formed in CMOS technology.

15. The detector device of claim 14, configured as at least one of the group consisting of an X-ray detector device, an ultraviolet detector, an optical detector device, and an infrared detector device.

16. The detector device of claim 14, configured as one of the group consisting of a cardio-vascular apparatus, a neurology apparatus, an orthopaedics apparatus, a mammography apparatus, a dental imaging apparatus, a baggage inspection apparatus, a medical application apparatus, a material testing apparatus and a material science analysis apparatus.

17. The unit of claim 1, said circuit being electrically coupled with a readout line.

18. The unit of claim 1, said shielding electrode being sandwiched between said charge collection electrode and said circuit.

19. A detector unit for detecting electromagnetic radiation, the detector unit comprising:
   a conversion material configured for converting impinging electromagnetic radiation into electric charge carriers:
   a charge collection electrode configured for collecting the converted electric charge carriers;
   a shielding electrode configured for forming a capacitance with the charge collection electrode; and
   an evaluation circuit electrically coupled with the charge collection electrode and configured for evaluating the electromagnetic radiation based on the collected electric charge carriers, the evaluation circuit being ohmically coupled with at least a part of the shielding electrode.

20. A detector unit for detecting electromagnetic radiation, the detector unit comprising:
   a conversion material configured for converting impinging electromagnetic radiation into electric charge carriers:
   a charge collection electrode configured for collecting the converted electric charge carriers;
   a shielding electrode configured for forming a capacitance with the charge collection electrode; and
   an evaluation circuit electrically coupled with the charge collection electrode and configured for evaluating the electromagnetic radiation based on the collected electric charge carriers, the shielding electrode comprising a first portion electrically coupled to the evaluation circuit, and comprising a second portion electrically decoupled from the evaluation circuit.

21. The detector unit of claim 20, wherein the second portion is electrically coupled with a reference potential.

22. The detector unit of claim 20, comprising an adjustment unit configured for adjusting the capacitance formed by the shielding electrode and the charge collection electrode by adjusting at least one of the first portion and the second portion.

23. An electromagnetic-radiation-detection method comprising:
   forming a shielding capacitance via a layer spatially intervening between layers respectively corresponding to a charge collection electrode and an evaluation circuit, said circuit for evaluating electromagnetic radiation based on charge carriers converted from impinging electromagnetic radiation and collected at said charge collection electrode.

24. A non-transitory, computer-readable medium, in which a computer program for detecting electromagnetic radiation is stored, said program being configured for controlling or carrying out, when being executed by a processor, the method of claim 23.

25. The method of claim 23, the intervening layer comprising a shielding electrode, said capacitance being formed between said shielding electrode and said charge collection electrode.

* * * * *